(12) United States Patent
Moradi et al.

(10) Patent No.: US 11,609,614 B2
(45) Date of Patent: Mar. 21, 2023

(54) APPARATUSES, METHODS, AND SYSTEMS FOR THERMOMECHANICAL PROTECTION OF ELECTRONICS INCLUDING COMPUTER COMPONENTS AND SENSORS

(71) Applicant: Intel Corporation, Santa Clara, CA (US)

(72) Inventors: Ali Moradi, Phoenix, AZ (US); Joseph B. Petrini, Gilbert, AZ (US); Michael A. Schroeder, Chandler, AZ (US); Shankar Devansenathipathy, Tempe, AZ (US); Atul N. Hatalkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 16/639,714

(22) PCT Filed: Sep. 20, 2017

(86) PCT No.: PCT/US2017/052525
§ 371 (c)(1),
(2) Date: Feb. 17, 2020

(87) PCT Pub. No.: WO2019/059906
PCT Pub. Date: Mar. 28, 2019

(65) Prior Publication Data
US 2021/0389805 A1 Dec. 16, 2021

(51) Int. Cl.
*G06F 1/16* (2006.01)
*H05K 5/00* (2006.01)
(Continued)

(52) U.S. Cl.
CPC .......... *G06F 1/1656* (2013.01); *G01S 7/4813* (2013.01); *G06F 1/206* (2013.01); *H05K 7/20318* (2013.01); *H05K 7/20327* (2013.01)

(58) Field of Classification Search
CPC ........ G06F 1/1656; G06F 1/203; G06F 1/206; H05K 7/20318; H05K 7/20327
See application file for complete search history.

(56) References Cited

U.S. PATENT DOCUMENTS 11,075,358 B2 * 7/2021 Kim .................... H01L 51/0097
2004/0058594 A1 * 3/2004 Kimata .................. F02B 75/22
440/77
(Continued)

FOREIGN PATENT DOCUMENTS

WO WO 2013-134176 A1 9/2013

OTHER PUBLICATIONS

International Search Report and Written Opinion dated Jun. 18, 2018 for International Patent Application No. PCT/US2017/052525, 16 pages.

*Primary Examiner* — Jinhee J Lee
(74) *Attorney, Agent, or Firm* — Schwabe, Williamson & Wyatt, P.C.

(57) ABSTRACT

Embodiments include apparatuses, systems and methods for a computer device with a casing and a substance in the casing substantially surrounding a computer component in the casing. In embodiments, the computer device may be a command and control computer, such as for example, an autonomous or semi-autonomous vehicle. In embodiments, the substance may be an electrically isolative and shear-thickening fluid to provide thermo-mechanical protection to a computer component. In the described embodiments, the substance may dampen mechanical shock or vibrational impact on the processor and the memory. The shear-thickening gel may further be thermally conductive in embodiments. In the embodiments, the casing may be substantially filled with the substance and the substance is to conduct heat away from the processor and the memory toward an outer (Continued)

edge of the casing. Other embodiments may also be described and claimed.

20 Claims, 6 Drawing Sheets

(51) Int. Cl.
*H05K 7/00* (2006.01)
*G01S 7/481* (2006.01)
*G06F 1/20* (2006.01)
*H05K 7/20* (2006.01)

(56) References Cited

U.S. PATENT DOCUMENTS

| | | | |
|---|---|---|---|
| 2007/0230100 A1* | 10/2007 | Locker | H05K 3/284 |
| | | | 361/679.01 |
| 2011/0242746 A1* | 10/2011 | Hoffman | H05K 7/20009 |
| | | | 29/829 |
| 2012/0096630 A1* | 4/2012 | Ferguson | B32B 3/12 |
| | | | 2/455 |
| 2014/0260935 A1* | 9/2014 | Kocher, Jr. | F41H 7/04 |
| | | | 89/36.02 |
| 2016/0330873 A1* | 11/2016 | Farshchian | H05K 7/20672 |

* cited by examiner

APPARATUSES, METHODS, AND SYSTEMS FOR THERMOMECHANICAL PROTECTION OF ELECTRONICS INCLUDING COMPUTER COMPONENTS AND SENSORS

CROSS REFERENCE TO RELATED APPLICATIONS

The present application is a national phase entry under 35 U.S.C. § 371 of International Application No. PCT/US2017/052525, filed Sep. 20, 2017, entitled "APPARATUSES, METHODS, AND SYSTEMS FOR THERMO-MECHANICAL PROTECTION OF ELECTRONICS INCLUDING COMPUTER COMPONENTS AND SENSORS", which designated, among the various States, the United States of America. The entirety of the PCT/US2017/052525 Application is hereby incorporated by reference.

FIELD

Embodiments relate generally to the technical field of semiconductor devices, and more particularly to protection of the devices from harsh mechanical and thermal environments, such as operating environments of autonomous or semi-autonomous vehicles, resource mining machinery, and other digitized equipment or vehicles.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

The complexity of advanced systems, such as for example, autonomous or semi-autonomous vehicles, devices using machine learning, digitized industrial equipment, and the like, demands increasingly larger computing capacity, which when exposed simultaneously to harsh mechanical and thermal environments, can cause performance deterioration of processors and other computing components. As one example, the current generation of CPUs for autonomous cars is not appropriately ruggedized to handle harsh conditions within vehicles and can lead to large failure rates due to repetitive fatigue of components. In addition, strong shocks can readily fracture sensitive components leading to passenger safety concerns due to inoperable hardware.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Embodiments described herein include a computing device that may provide thermo-mechanical protection for a computer component that may have a processor and a memory coupled to the processor. In embodiments, the computing device may offer protection to the computer component from harsh environments, e.g., extreme cold, heat, or mechanical shocks, such as may occur in the operating environments of autonomous or semi-autonomous vehicles or machinery. For example, in various embodiments, the computing device may include or be part of a command and control apparatus for an autonomous or semi-autonomous driving vehicle, an unmanned aerial vehicle, an oil exploration drill bit, or a robot. In embodiments, the computing device may include or be part of any instrument or tool that engages in machine learning. In same or similar embodiments, the computing device may be included in digitized industrial components including or in addition to systems or devices employing autonomous activity.

Accordingly, in embodiments, the computing device may have a casing to include a visco-elastic substance to substantially surround the computer component. In embodiments, the visco-elastic substance is a shear-thickening fluid or substance (also known as a dilatant fluid). In embodiments, the shear-thickening property may provide dampening of mechanical shock or vibrational impact on the computer component by providing increased resistance as force increases. The shear-thickening fluid may also be thermally conductive and electrically isolating in embodiments. According to various embodiments, a vapor-compression refrigeration system such as included in an autonomous or semi-autonomous car or other cooling system may be coupled to the computing device to assist in removing heat from the computing device.

Figure 1:
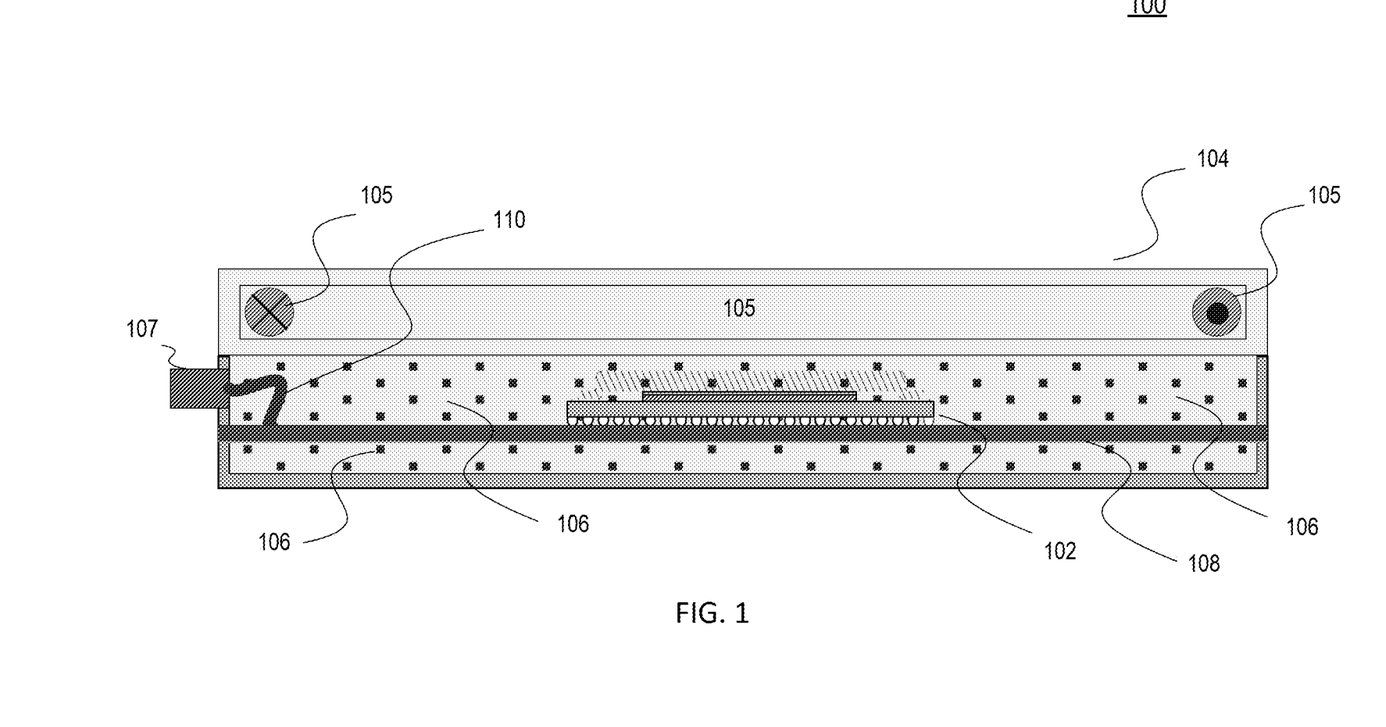
FIG. 1 is a cross-sectional view of an example computing device including a substance to thermally and mechanically protect a computing component in accordance with various embodiments.

FIG. 1 is a cross-sectional view of an example computing device 100 including a substance 106 to thermally and mechanically protect a computer component 102 in accordance with various embodiments. In embodiments, computing device 100 may include a casing 104 to encase or otherwise enclose computer component 102 and substance 106. In embodiments, computer component 102 may be substantially surrounded by substance 106, which may be, in embodiments, a thermally conducting, electrically isolating, and shear-thickening fluid or substance to viscously dampen mechanical shock or vibrational impact on computer component 102, making computer component 102 particularly suitable for harsh operating environment. In embodiments, the environments may include the operating environment of autonomous or semi-autonomous vehicles. Substance 106, in embodiments, may be a gel-like material such as a shear-thickening gel that may be thermally conductive to conduct heat away from computer component 102. In embodiments, coolant passage(s) 105 may assist in removing the thermally conducted heat away from computing device 100. In embodiments, computer component 102 may be a logic circuit having a processor and a memory and/or any suitable device having sensitive components that may benefit from thermo-mechanical protection. In various embodiments, computer component 102 may include, for example, a hardware accelerator, a graphics processor, a signal processor, or a communication device. As seen in FIG. 1, computer component 102 may be coupled to a computer board such as printed circuit board (PCB) 108. In embodiments and as shown in FIG. 1, PCB 108 may be surrounded by substance 106. In other embodiments (not shown), PCB 108 may be only partially surrounded by substance 106.

For the embodiment, connector 107 may be included on a surface panel 105 of casing 104. In embodiments, surface panel 105 may be coupled to receive sensor signals indicating at least one of temperature, pressure, and an inertial measurement unit (IMU) from an environment external to casing 104. In embodiments, the sensor signals may include radiofrequency (RF) signals received from RF antennas located on surface panel 105. Within casing 104, in embodiments, connection circuitry 110 may be suspended in substance 106 to provide the sensor or other signals to PCB 108. In embodiments, connection circuitry 110 may include high-bandwidth cables. According to embodiments, surface panel 105 may be externally connected to other devices using power cables, sensor cables, high-bandwidth network cables, and the like. In various embodiments, the external connections may be sealed to prevent leakage of substance 106 and in some embodiments may include non-rigid, flexible, or other shock-absorbing material to further assist in absorbing mechanical or vibrational shock.

Figure 2:
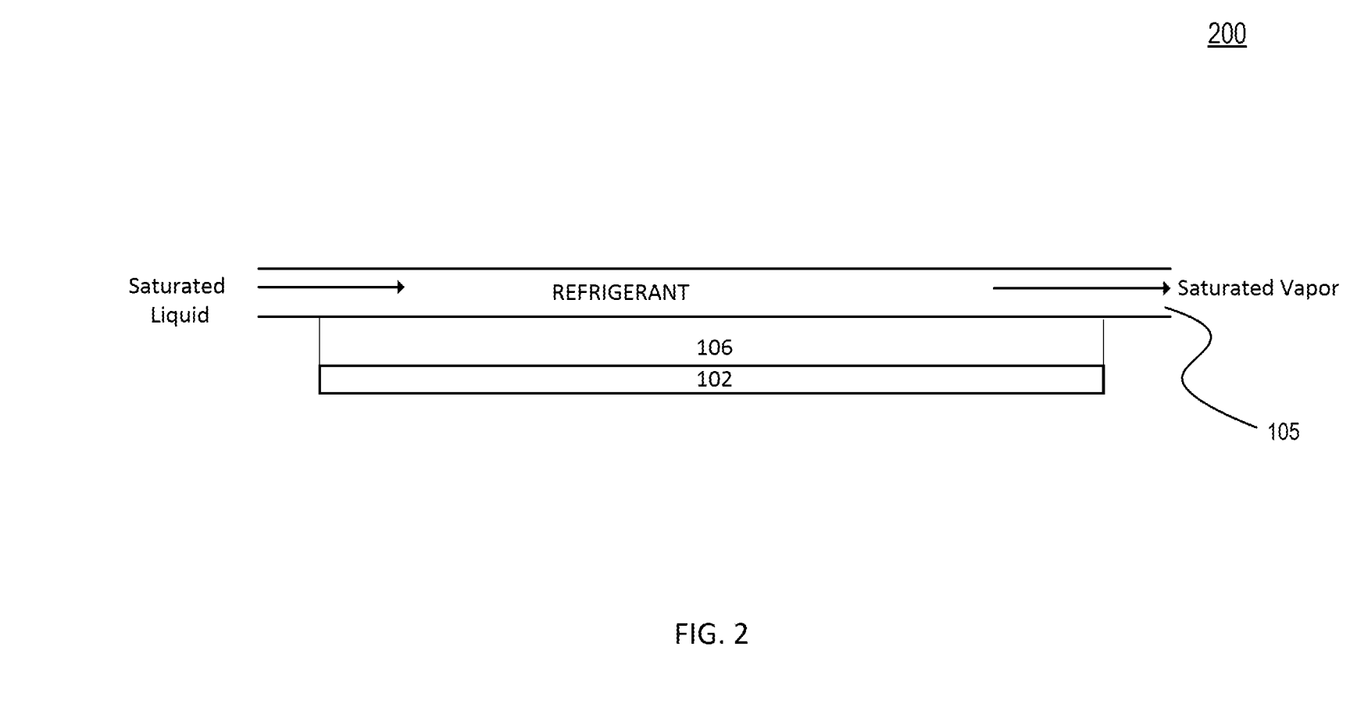
FIG. 2 is a simplified diagram of the cross-sectional view of the example computing device of FIG. 1 in accordance with various embodiments.

To further illustrate, FIG. 2 is a simplified diagram 200 of the cross-sectional view of the example computing device of FIG. 1, in accordance with various embodiments. In embodiments, coolant passage(s) 105 may provide a heat-transfer fluid, such as for example, a refrigerant (e.g., R-134a) to absorb heat from substance 106. Accordingly, in embodiments, the refrigerant may enter coolant passage(s) 105 as saturated liquid and subsequently leave computing device 100 as saturated vapor. In some embodiments, coolant passage(s) 105 may in fact be one or more warming passages. For example, in various embodiments, heated fluid may be provided to warm computer component 102 or PCB 108 in environments that may be extremely cold (e.g., Antarctica or elsewhere). In embodiments, such fluid may be warmed by heat generated by, e.g., industrial equipment including the computing device. Accordingly, the heated fluid may subsequently be provided through coolant passage(s) 105. Note that in embodiments, coolant passage(s) 105 may include one or more cooling pipes and/or may include a broader compartment encompassing an area contiguous to substance 106. In some embodiments, such cooling pipes may include be composed of copper or of other conductive material. Note that in various embodiments, convective heat transfer may be employed in addition to conductive heat transfer. In some embodiments, a surface roughness of the one or more cooling passage(s) 105 may be increased to induce greater levels of turbulence and therefore convective heat transfer.

As noted above, in embodiments, substance 106 may be a visco-elastic substance such as a shear-thickening gel to viscously dampen mechanical shock or vibrational impact on computer component 102. In embodiments, the visco-elastic substance may be shear-thickening having stress/strain curves are similar and/or same to a dilatant fluid. Note that in embodiments, the gel may be an off-the shelf shear-thickening gel or one that may be custom-produced for a particular application. In some embodiments, the gel may be a silicon-polymer based liquid gel and may include nano-metal fibers or diamond powder as a filler to allow for rapid transfer of heat toward outer edges of casing 104. In various embodiments, the gel may have thermo-conductive properties determined based at least in part upon a level of power to be generated by computer component 102 and physical dimensions of casing 104. Note that in embodiments, the gel may have a thermal conductivity of 0.6-2 watts per meter-kelvin (W/m-K).

Figure 3:
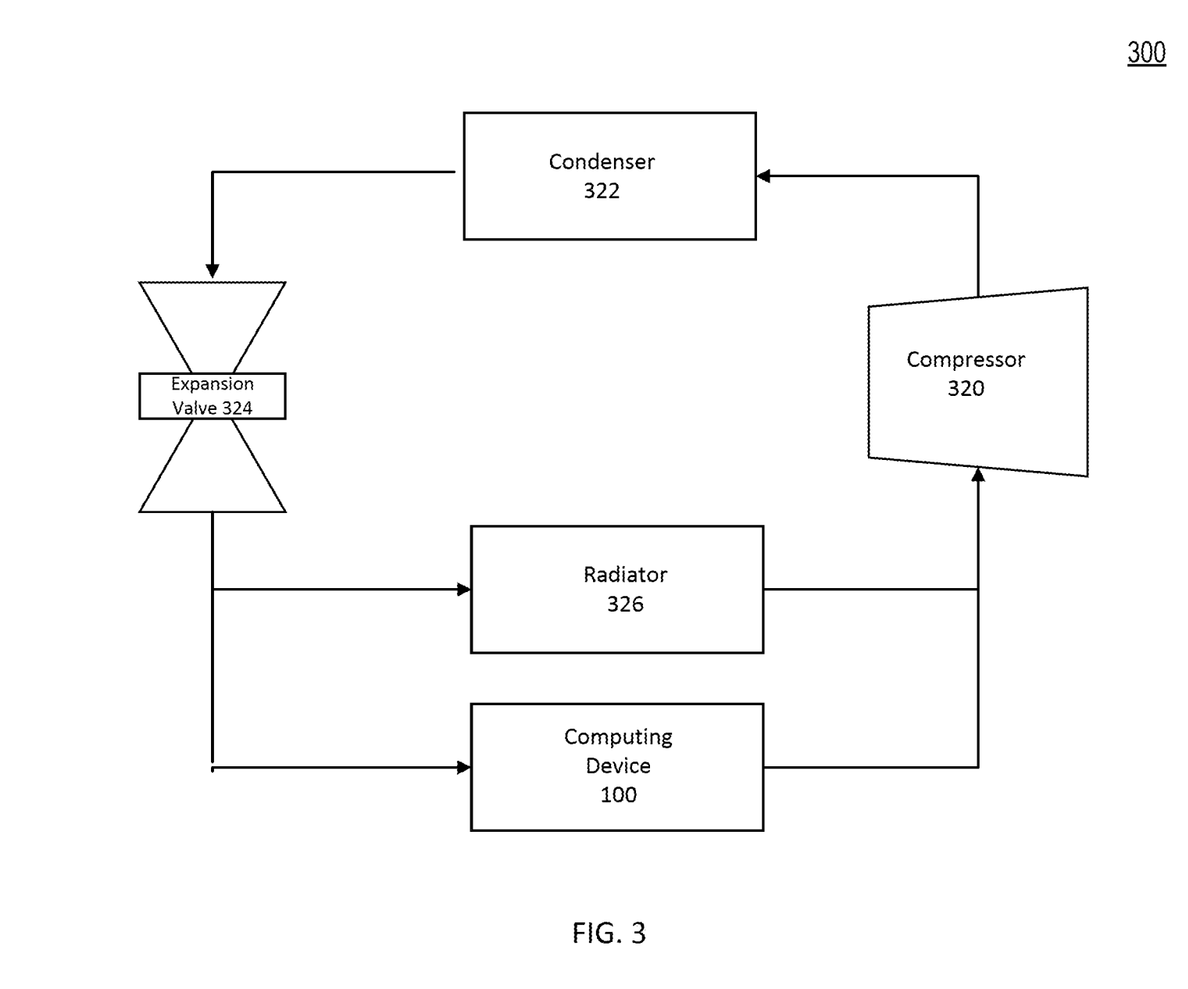
FIG. 3 is a block diagram of a modified vapor-compression refrigeration cycle that may be coupled to the computing device of FIGS. 1 and 2 in accordance with various embodiments.

In embodiments, coolant passages 105 may be coupled to a cooling system that utilizes a vapor compression refrigeration cycle, e.g., similar to that used by a standard cooling system of an autonomous or semi-autonomous vehicle. In embodiments, cooled refrigerant (e.g., saturated liquid as shown in FIG. 2) from an autonomous vehicle's cooling system may be provided to computing device 100 to absorb heat from substance 106. To illustrate, FIG. 3 is a simplified block diagram 300 of a vapor-compression refrigeration cycle modified to be coupled to computing device 100 in accordance with various embodiments. In embodiments, a compressor 320 may compress refrigerant from a low pressure vapor state to a high pressure vapor state and subsequently provide the refrigerant to a condenser 322. Condenser 322 may cool and condense the refrigerant from the high pressure vapor state to a high pressure liquid state, which may then be provided to expansion valve 324, which may remove pressure from the refrigerant, in the embodiment.

For the embodiments, once the refrigerant has cooled, a portion of the refrigerant may be extracted via a flow control valve from expansion valve 324 and provided to cooling passages 105 of computing device 100. In embodiments, due to thermal conductivity of substance 106 and a large enthalpy drop due to phase change of the refrigerant in the vapor-compression refrigeration cycle, rapid heat removal from computing device 100 may occur. Accordingly, in embodiments, heat removal from computing device 100 as described herein may be a very simple and cost-effective solution to the problem of harsh environments. In some embodiments, the substance may have thermo-conductive properties determined based at least in part upon a level of power to be generated by the computing device 100 and physical dimensions of casing 104. In embodiments, the remaining portion of the refrigerant may continue to radiator 326 of the cooling system. Note that in some embodiments, a rate of heat removal may be controlled such that the substance may capacitively store heat to control a level of heat to be cooled by the cooling system.

Note that although FIGS. 1-3 above are discussed herein using the specific example of the vapor-compression refrigeration cycle, in other embodiments, any suitable liquid cooling system or other cooling system that allows transfer of heat from substance 106 in computing device 100 may be used. Thus, note that in embodiments, any suitable cooling system used in industrial components or machinery such as, e.g., in resource mining, may be contemplated. In various embodiments, an example computing device used in the industrial components or machinery may perform machine learning or other advanced computing tasks. In addition, note that although cooling passages 105 are illustrated above as located at an upper location of computing device 100, it is apparent that in various embodiments, cooling passages 105 may be located at additional locations and/or at another location proximate to casing 104 to facilitate heat transfer. For example, cooling passages 105 may be located at both an upper and lower location of computing device 100 to increase a rate of cooling of computing device 100.

Figure 4:
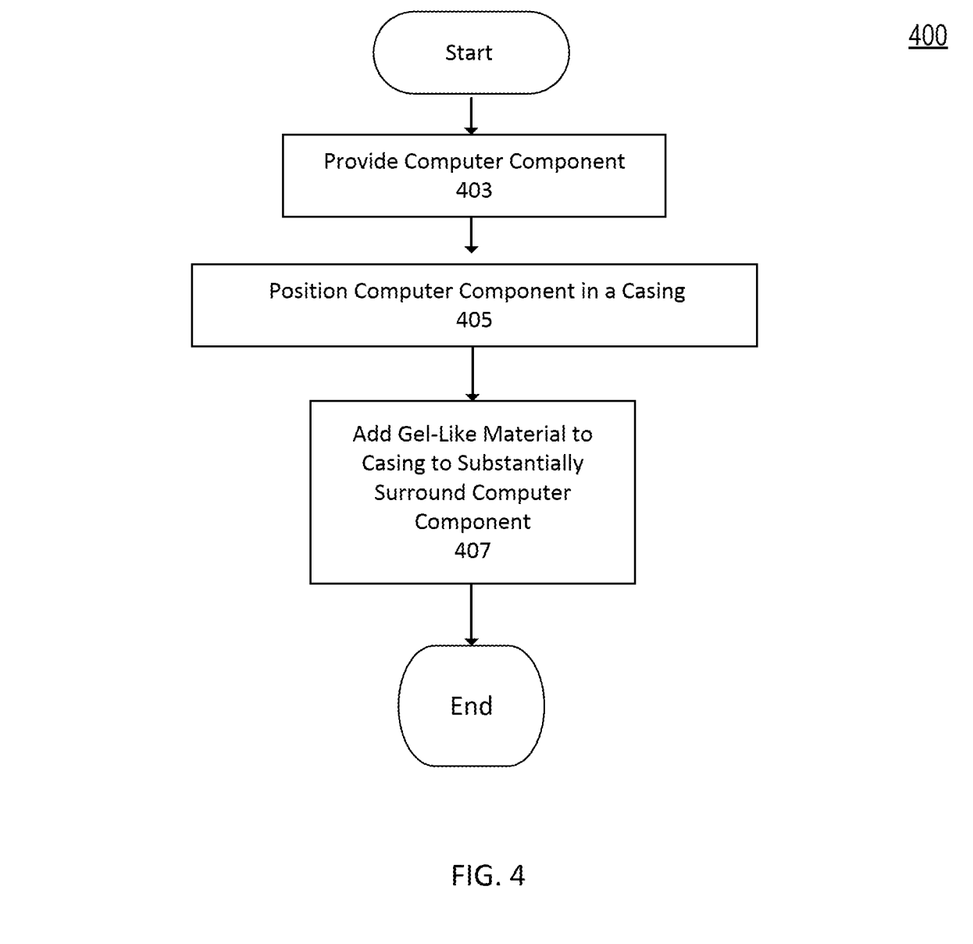
FIG. 4 is an example flow diagram of a method associated with FIGS. 1-3 in accordance with various embodiments.

FIG. 4 is an example flow diagram of a method associated with FIGS. 1-3, in accordance with various embodiments. For the embodiment, a computer component associated with an advanced computing system such as an onboard computer for a semi-autonomous or autonomous vehicle may be provided at a block 403. In various embodiments, the computer component may include one or more computer units such as for example, special purpose accelerators, memory, storage, and/or various communication devices. Further note that although only one computer component 102 is illustrated as coupled to PCB 108 in FIG. 1, in various embodiments, a plurality of computer components may be coupled to PCB 108. At a next block 405, the computer component may be positioned in a casing, similar to casing 104 of FIG. 1. In embodiments, the casing may have exterior insulated walls to protect its contents from ambient heat due to external environments such as, for example, engine heat or heat or cold from extreme weather. In embodiments, at a next block 407, a shear-thickening substance such as a gel-like material may be added to the casing to substantially surround the computer component. In embodiments, the gel-like material may allow thermal conduction of heat away from the computer component toward an outside panel of the casing while providing dampening of mechanical stress on the computer component. In embodiments, the process may end at end block 409.

Figure 5:
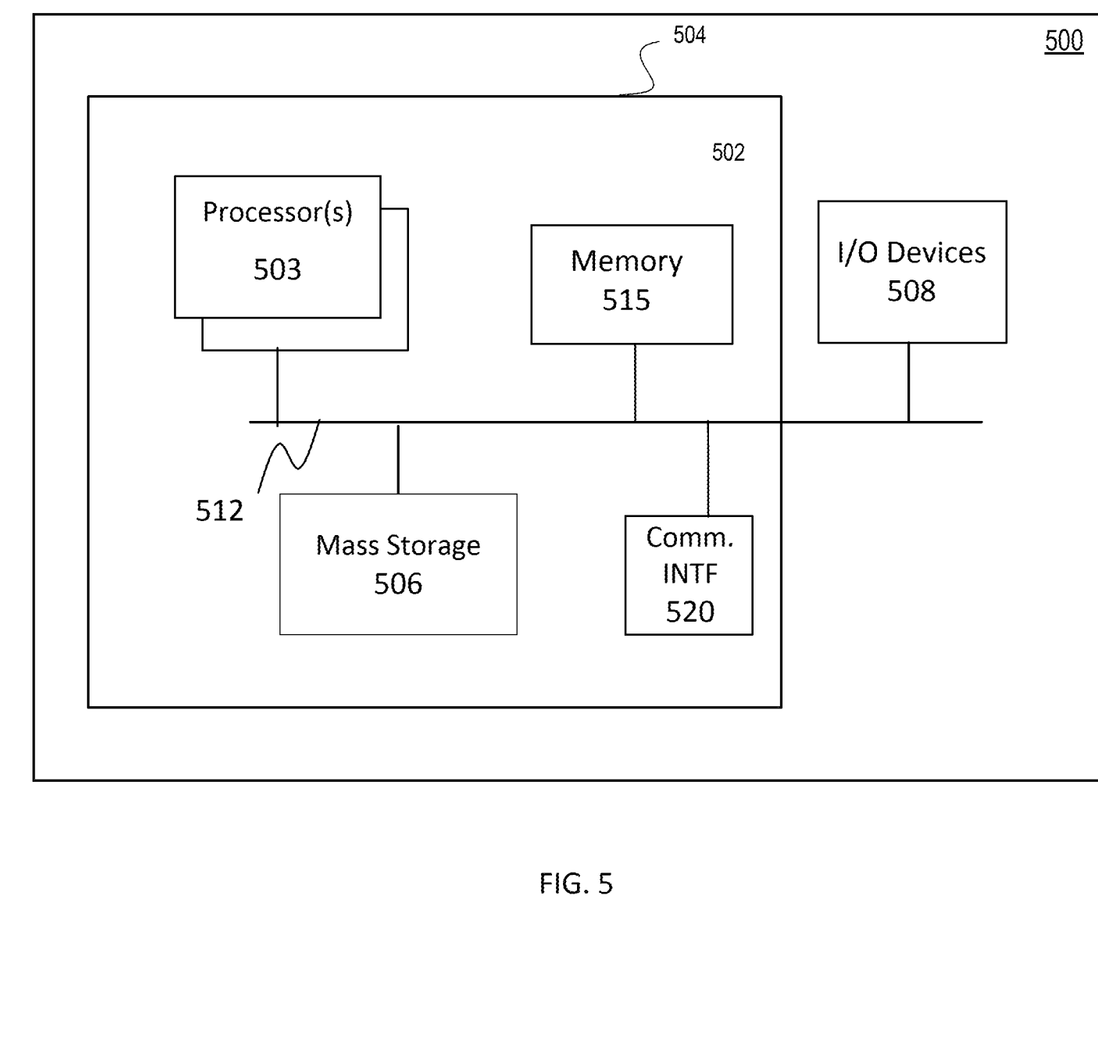
FIG. 5 illustrates an example system in accordance with various embodiments.

FIG. 5 illustrates an example system 500 that may be suitable for use to practice selected aspects of the present disclosure. In embodiments, system 500 may include a casing 504 filled with a gel-like substance to substantially surround a computer 502. In embodiments, system 500 may include any suitable system where computer components of computer 502 may be subject to heat and/or mechanical and vibrational shocks. For example, system 500 may include, in various embodiments, an autonomous or semi-autonomous vehicle, unmanned aerial vehicle, robot, and/or a space rocket. As embodiments may provide an isolated environment for a computing unit, computer 502 may provide a platform for other exposed applications such as oil exploration (e.g., oil drill bit) and agriculture. In embodiments, advantages may include allowing circuitry and chips to perform advanced tasks, such as related to machine learning and/or autonomous tasks, while located in inhospitable environments without sacrificing performance. Proposed embodiments are not restricted to large computing units and embodiments may include, e.g., small sensors that may be actively coupled to a compute unit while performing a variety of actions. In other embodiments, casing 504 may be used in reflow ovens to protect sensitive electronic components from extreme heat or other ambient conditions. Note that in some embodiments, various elements described below, although shown as located within casing 504, may remain coupled to elements within casing 504 but for design or other reasons that may be apparent, located outside of casing 504.

Computer 502 may include one or more processors or processor cores 503, and a system memory 515. For the purpose of this application, including the claims, the term "processor" refers to a physical processor, and the terms "processor" and "processor cores" may be considered synonymous, unless the context clearly requires otherwise. Additionally, computer 500 may include mass storage devices 506 (such as diskette, hard drive, compact disc read only memory (CD-ROM) and so forth), communication interfaces 520 (such as network interface cards, modems, infrared receivers, radio receivers (e.g., Bluetooth), and so forth). The elements may be coupled to each other via system bus 512, which may represent one or more buses. In the case of multiple buses, they may be bridged by one or more bus bridges (not shown). In embodiments, the elements may be coupled to a computer board. In some embodiments, bus 512 may represent interconnection circuitry suspended in the gel-like substance to provide a connection between elements within casing 504 and those located outside of casing 504, e.g., various I/O devices 508.

Note that in embodiments, communication interfaces 520 may include one or more communications chips and may enable wired and/or wireless communications for the transfer of data to and from the computing device 500. In some embodiments, communication interfaces 520 may be located on a surface panel of casing 504 and include a transceiver including a transmitter and receiver or a communications chip including the transceiver. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication interfaces 520 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The communication interfaces 520 may include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, Ev-DO, and others.

Each of these elements described above may perform its conventional functions known in the art. The number, capability and/or capacity of these elements 508-520 may vary, depending on what type of system, as discussed above, that computer 500 is a part of Otherwise, the constitutions of elements 508-515 are known, and accordingly will not be further described.

Figure 6:
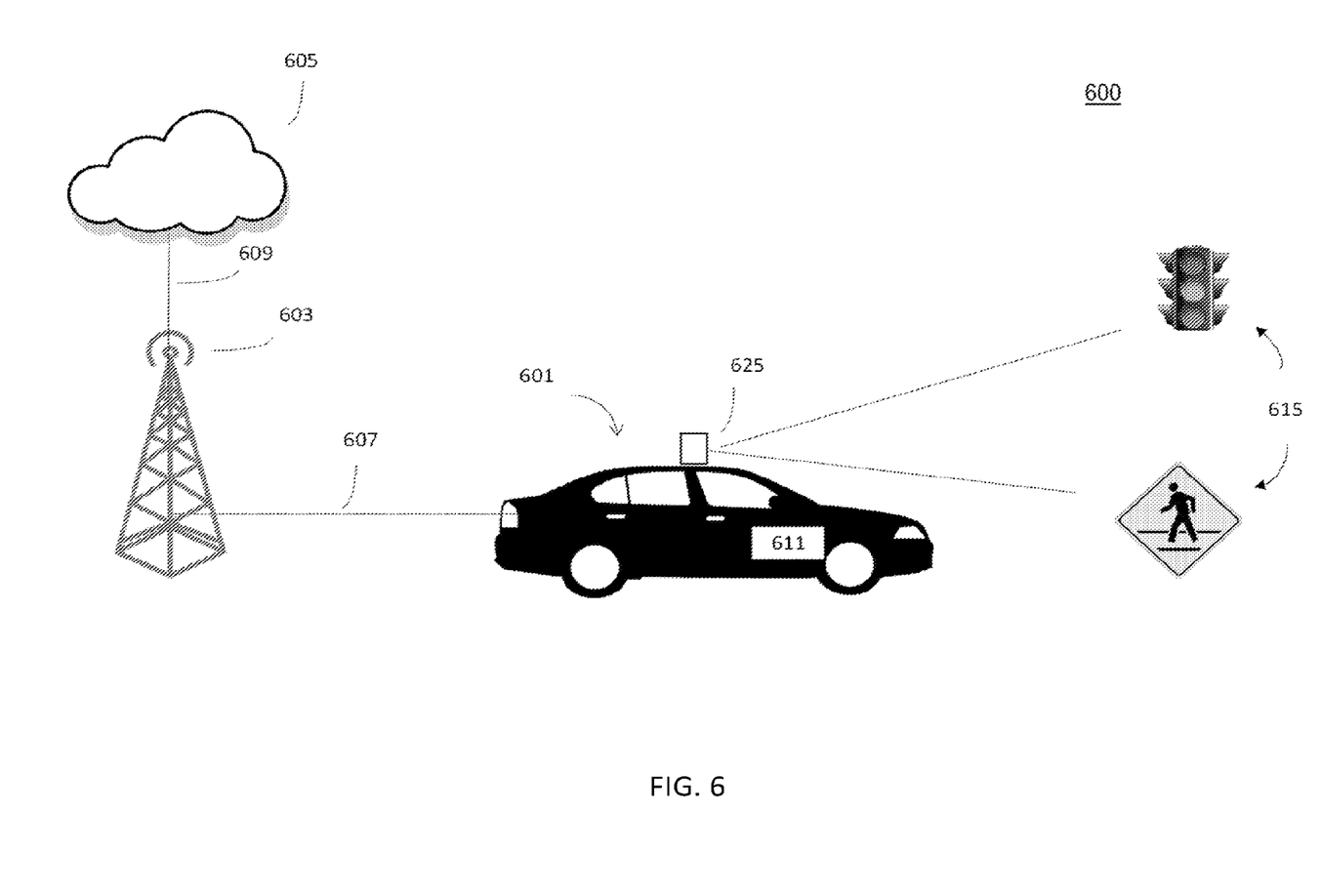
FIG. 6 illustrates an environment in which various embodiments described with references to FIGS. 1-5 may be practiced.

FIG. 6 illustrates an environment 600 in which various embodiments described with references to FIGS. 1-5 may be practiced. Environment 600 includes vehicle 601, a wireless access node 603, objects 615, and a cloud computing service 605 (also referred to as "cloud 605", "the cloud 605", and the like). In embodiments, vehicle 601 may be an autonomous or semi-autonomous vehicle including a vehicle computing device (VCD) 611, having a casing to include a visco-elastic substance that is shear-thickening to substantially surround a plurality of computer components. In embodiments, the shear-thickening substance may thermally protect as well as viscously dampen mechanical shock or vibrational impact on the computer components. According to various embodiments and as described in connection with FIG. 3, VCD 611 may be coupled to a cooling system or air-conditioning system of vehicle 601.

For illustrative purposes, the following description is provided including vehicle 601 as a passenger car in a roadway environment. However, the embodiments described herein are also applicable to any type of vehicle, machinery, or application using autonomous activity, or machine learning, in a harsh environment. In embodiments, other vehicles may include, for example, such as trucks, buses, motorcycles, boats or motorboats, and/or any other motorized devices that may benefit from thermo-mechanical protection of sensitive computer components. For example, water vehicles such as boats, speedboats, ferries, barges, hovercrafts, other water vehicles etc., may also be exposed to harsh environments and may benefit from thermo-mechanical protection of computer components as well. The embodiments described herein may also be applicable to flying objects, such as space rockets, aircraft, drones, unmanned aerial vehicles (UAVs), industrial equipment, and/or to any other like motorized devices. As noted previously, embodiments may also include oil exploration devices such as drill bits and/or space applications, or other suitable applications where computational complexity may be required in a harsh environment.

The vehicle 601 may be any type of motorized vehicle or device used for transportation of people or goods, which may be equipped with controls used for driving, parking, passenger comfort and/or safety, etc. The terms "motor", "motorized", etc., as used herein may refer to devices that convert one form of energy into mechanical energy, and may include internal combustion engines (ICE), compression combustion engines (CCE), electric motors, and hybrids (e.g., including an ICE/CCE and electric motor(s)). Although FIG. 6 shows only a single vehicle 601, vehicle 601 may represent a plurality of individual motor vehicles of varying makes, models, trim, etc., which may be collectively referred to herein as the "vehicle 601." As noted earlier in connection with computer, in embodiments, the casing of VCD 611 may have exterior insulated walls to further insulate the computer components from ambient heat due to external environments such as, for example, engine heat of an autonomous or semi-autonomous vehicle or heat or cold from extreme weather. In embodiments, cooling passages similar to those discussed with respect to the above Figures may remove heat generated by the computer components internal to VCD 611.

In embodiments, vehicle 601, as noted above, may include a vehicle computing device (VCD) 611, similar to computing device 100 described in FIG. 1. In embodiments, VCD 611 may be any type of computer device that is mounted on, built into, or otherwise embedded in a vehicle and is capable of controlling complex command and control functions associated with a semi-autonomous or autonomous vehicle. In embodiments, data obtained by the VCD 611 may include sensor data from one or more sensors embedded in the vehicle 601, data packets from other VCD 611s included in other vehicles 601 (not shown), data packets and/or data streams from cloud 605 and/or network infrastructure (e.g., core network elements of a cellular communications network, etc.), navigation signaling/data from on-board navigations systems (e.g., global navigation satellite system (GNSS), global positioning system (GPS), etc.), and/or the like.

For example, as illustrated for the embodiment, vehicle 601 may include, for example, a light detection and ranging (LIDAR) sensor 625 to locate itself and other objects, e.g, objects 615, in an environment. In embodiments, signals from LIDAR sensor 625 as well as multiple video cameras (not shown) may comprise incoming sensor data to VCD 611. In embodiments, high performance sensitive devices, e.g., such as for example but not limited to, central processing units (CPUs), graphic processing units (GPUs), field-programmable gate arrays (FPGAs), may collaborate to analyze the incoming sensor data. In embodiments, VCD 611 including a visco-elastic substance to substantially surround the sensitive devices may provide thermal regulation in such cases where high computational demand may use large amounts of power, e.g., upwards of 500 Watts (W).

In embodiments, VCD 611 may also include, or operate in conjunction with communications circuitry and/or input/output (I/O) interface circuitry in order to obtain the data for the various sources. As noted in connection with FIG. 1, surface panels of the casing may externally connect to other devices using power cables, sensor cables, high-bandwidth network cables, and the like. In various embodiments, the external connections may be sealed to prevent leakage of visco-elastic gel and in some embodiments may include flexible material to further assist in absorbing mechanical or vibrational shock. In embodiments, the surface panels may house indicators or other actuators on a surface of the casing, e.g., lights, displays, etc., which may be coupled to internal computer boards, e.g. PCB 108, via interconnects, e.g., connection circuitry 110, as described in connection with FIG. 1. As noted earlier, in embodiments, sensor signals may include radiofrequency (RF) signals received from RF antennas located on one or more surface panels.

The communications circuitry of the vehicle 601 may communicate with the cloud 605 via wireless access node 603. The wireless access node 603 may be one or more hardware computer devices configured to provide wireless communication services to mobile devices (for example, VCD 611 in vehicle 601 or some other suitable device) within a coverage area or cell associated with the wireless access node 603. The wireless access node 603 may include a transmitter/receiver (or alternatively, a transceiver) connected to one or more antennas, one or more memory devices, one or more processors, one or more network interface controllers, and/or other like components. The one or more transmitters/receivers may be configured to transmit/receive data signals to/from one or more mobile devices via a link (e.g., link 607). Furthermore, one or more network interface controllers may be configured to transmit/receive with various network elements (e.g., one or more servers within a core network, etc.) over another backhaul connection (not shown). In embodiments, the VCD 611 may generate and transmit data to the wireless access node 603 over link 607, and the wireless access node 603 may provide the data to the cloud 605 over backhaul link 609. Additionally, during operation of the vehicle 601, the wireless access node 603 may obtain data intended for the VCD 611 from the cloud 605 over link 609, and may provide that data to the VCD 611 over link 607. The communications circuitry in the vehicle 601 may communicate with the wireless access node 603 in accordance with one or more wireless communications protocols as discussed herein.

As an example, the wireless access node 603 may be a base station associated with a cellular network (e.g., an eNB in an LTE network, a gNB in a new radio access technology (NR) network, a WiMAX base station, etc.), an RSU, a remote radio head, a relay radio device, a smallcell base station (e.g., a femtocell, picocell, home evolved nodeB (HeNB), and the like), or other like network element. In embodiments where the wireless access node is a base station, the wireless access node 603 may be deployed outdoors to provide communications for the vehicle 601 when the vehicle 601 is operating at large, for example when deployed on public roads, streets, highways, etc.

In some embodiments, the wireless access node 603 may be a gateway (GW) device that may include one or more processors, communications systems (e.g., including network interface controllers, one or more transmitters/receivers connected to one or more antennas, and the like), and computer readable media. In such embodiments, the GW may be a wireless access point (WAP), a home/business server (with or without radio frequency (RF) communications circuitry), a router, a switch, a hub, a radio beacon, and/or any other like network device. In embodiments where the wireless access node 603 is a GW, the wireless access node 603 may be deployed in an indoor setting, such as a garage, factory, laboratory or testing facility, and may be used to provide communications for while parked, prior to sale on the open market, or otherwise not operating at large.

In embodiments, the cloud 605 may represent the Internet, one or more cellular networks, a local area network (LAN) or a wide area network (WAN) including proprietary and/or enterprise networks, Transfer Control Protocol (TCP)/Internet Protocol (IP)-based network, or combinations thereof. In such embodiments, the cloud 605 may be associated with network operator who owns or controls equipment and other elements necessary to provide network-related services, such as one or more base stations or access points (e.g., wireless access node 603), one or more servers for routing digital data or telephone calls (for example, a core network or backbone network), etc. Implementations, components, and protocols used to communicate via such services may be those known in the art and are omitted herein for the sake of brevity.

In some embodiments, the cloud 605 may be a system of computer devices (e.g., servers, storage devices, applications, etc. within or associated with a data center or data warehouse) that provides access to a pool of computing resources. The term "computing resource" may refer to a physical or virtual component within a computing environment and/or within a particular computer device, such as memory space, processor time, electrical power, input/output operations, ports or network sockets, and the like. In these embodiments, the cloud 605 may be a private cloud, which offers cloud services to a single organization; a public cloud, which provides computing resources to the general public and shares computing resources across all customers/users; or a hybrid cloud or virtual private cloud, which uses a portion of resources to provide public cloud services while using other dedicated resources to provide private cloud services. For example, the hybrid cloud may include a private cloud service that also utilizes one or more public cloud services for certain applications or users, such as providing obtaining data from various data stores or data sources. In embodiments, a common cloud management platform (e.g., implemented as various virtual machines and applications hosted across the cloud 605 and database systems) may coordinate the delivery of data to the VECD 611 of vehicle 601. Implementations, components, and protocols used to communicate via such services may be those known in the art and are omitted herein for the sake of brevity. Some non-limiting Examples are provided below.

Example 1 is a computer apparatus to provide protection for a computer device, comprising: a computer component including: a processor; a memory coupled to the processor; and a casing to include a substance to substantially surround the computer component to dampen mechanical shock or vibrational impact on the processor and the memory of the computer component.

Example 2 is the computer apparatus of Example 1, wherein the substance is to further thermally conduct heat away from the computer component Example 3 is the computer apparatus of Example 2, wherein the substance is an electrically isolative and thermally conductive gel or liquid.

Example 4 is the computer apparatus of Example 1, wherein the substance is a shear-thickening gel to viscously dampen the mechanical shock or vibrational impact on the processor and the memory.

Example 5 is the computer apparatus of Example 1, wherein the casing is substantially filled with the substance and the substance is to conduct heat away from the processor and the memory toward an outer edge of the casing.

Example 6 is the computer apparatus of Example 1, wherein the processor and the memory are coupled to a computer board and the computer board is at least partially surrounded by the substance.

Example 7 is the computer apparatus of Example 6, further comprising connection circuitry at least partially surrounded by the substance and coupled to provide a signal between a panel of the casing and the computer board.

Example 8 is the computer apparatus of Example 1, wherein the casing to include an exterior panel to receive incoming sensor data from a light detection and ranging (LIDAR) sensor of an autonomous or semi-autonomous vehicle.

Example 9 is the computer component of any one of Examples 1-8, wherein the computer component comprises a hardware accelerator, a graphics processor, a signal processor, or a communication device to collaborate to analyze incoming sensor data from a LIDAR sensor.

Example 10 is a method of providing a computer component and protection for the computer component from potential vibrational force, comprising: providing the computer component, wherein the computer component includes a processor and a memory; positioning the computer component in a casing; and adding a gel-like material to the casing to substantially surround the computer component, wherein the gel-like material to allow thermal conduction of heat away from the processor and the memory toward an outside panel of the casing.

Example 11 is the method of Example 10, wherein adding the gel-like material comprises filling the casing with a shear-thickening gel to allow for viscous dampening of mechanical stress.

Example 12 is the method of any one of Examples 10 and 11, wherein adding a gel-like material to the casing comprises adding a silicon-polymer based liquid gel to the casing.

Example 13 is a computer unit, comprising: means for protecting a computer board; and means for thermally conducting heat away from the computer board within the means for protecting the computer board.

Example 14 is the computer unit of Example 13, wherein the means for thermally conducting heat away from the computer board includes means for viscously dampening vibrational force on the computer board.

Example 15 is the computer unit of Example 14, further comprising cooling means for removing the heat conducted away from the computer board.

Example 16 is a system to provide thermo-mechanical protection to a computer unit, including: a computer unit including a printed circuit board and including electronic components coupled to the printed circuit board; a casing to include a visco-elastic substance to substantially surround the computer unit and to thermally conduct heat away from heat generated by the electronic components unit toward an outer panel of the casing; and a cooling system, coupled to the casing to remove at least some of the thermally-conducted heat from the casing.

Example 17 is the system of Example 16, wherein the cooling system to include pipes within the casing to provide a refrigerant to assist in removal of the at least some of the thermally-conducted heat from the casing.

Example 18 is the system of Example 17, wherein the cooling system is coupled to a vapor-compression refrigeration cycle to remove at least some of the thermally-conducted heat from the casing.

Example 19 is the system of Example 16, wherein the cooling system to capacitively store heat in the visco-elastic substance to control a level of heat to be cooled by the cooling system.

Example 20 is the system of Example 16, further comprising circuitry wherein the computer unit to perform tasks related to machine-learning and/or autonomous activity.

Example 21 is the system of Example 16, wherein an outside surface of the casing to include sensor connections coupled to receive signals indicating at least one of temperature, pressure, and an inertial measurement unit (IMU) and wherein the circuitry to provide the signals to the printed circuit board.

Example 22 is the system of Example 21, further comprising radiofrequency (RF) antennas on the outside surface of the casing to receive a signal to be provided to the printed circuit board.

Example 23 is the system of Example 16 wherein the visco-elastic substance comprises a gel having thermo-conductive properties determined based at least in part upon a level of power to be generated by the computer unit and a physical dimension of the casing.

Example 24 is the system of Example 23, wherein the gel has a thermal conductivity of 0.6-2 watts per meter-kelvin (W/m-K).

Example 25 is the system of any one of Examples 16-24, wherein the computer unit comprises a command and control computer for an autonomous or semi-autonomous driving vehicle, an unmanned aerial vehicle, or a robot.

Example 26 is a system to protect a computer component from potential temperature and mechanical force during autonomous activity, comprising: a casing including the computer component; a computer board coupled to the computer component; and a shear-thickening gel substantially filling the casing to surround the computer component and the computer board to protect the computer component from mechanical force and to absorb heat from the computer component; and a temperature-regulating system, coupled to the casing to remove at least some of the absorbed heat from the shear-thickening gel to an environment external to the casing.

Example 27 is the system of Example 26, wherein the casing to include an exterior panel to receive incoming sensor data including temperature, pressure, or an inertial measurement unit (IMU) from the environment external to the casing.

Example 28 is the system of Example 27, wherein the computer component comprises a hardware accelerator, a graphics processor, a signal processor, or a communication device to collaborate to analyze the incoming sensor data.

Example 29 is the system of Example 26, further comprising high-speed interconnection cables suspended in the shear-thickening gel to provide a sensor signal between the casing and the computer board.

Example 30 is the system of Example 26, wherein the temperature regulating system comprises pipes or a compartment located proximate to the shear-thickening gel in the casing.

Example 31 is the system of Example 26, wherein the temperature regulating system comprises a system capable to provide heat to the shear-thickening gel and wherein the shear-thickening gel capable to thermally conduct the heat to the computer component.

Example 32 is the system of Example 26, wherein the shear-thickening gel includes a matrix including nano-metal fibers or diamond powder.

Example 33 is the system of any one of Examples 26-32, wherein the system comprises industrial or agricultural machinery and the computer component to include a processor and a memory to perform machine learning for the industrial or agricultural machinery.

Although certain embodiments have been illustrated and described herein for purposes of description, this application is intended to cover any adaptations or variations of the embodiments discussed herein. Therefore, it is manifestly intended that embodiments described herein be limited only by the claims. Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A computer apparatus to provide protection for a computer device, comprising: a computer component including: a processor; and a memory coupled to the processor; and a casing that includes a gel with thermo-conductive properties that are determined based at least in part upon a level of power to be generated by the computer component and physical dimensions of the casing, wherein the gel substantially surrounds the computer component to: dampen mechanical shock or vibrational impact on the processor and the memory of the computer component, and thermally conduct heat away from the computer component; and a cooling system, coupled to the casing to remove at least some of the thermally-conducted heat from the casing, wherein the cooling system includes pipes within the casing to provide a refrigerant to assist in removal of the at least some of the thermally-conducted heat from the casing, wherein the refrigerant is physically separate from the visco-elastic substance.

2. The computer apparatus of claim 1, wherein the gel is an electrically isolative and thermally conductive gel or liquid.

3. The computer apparatus of claim 1, wherein the gel is a shear-thickening gel to viscously dampen the mechanical shock or vibrational impact on the processor and the memory.

4. The computer apparatus of claim 1, wherein the casing is substantially filled with the gel and the gel is to conduct heat away from the processor and the memory toward an outer edge of the casing.

5. The computer apparatus of claim 1, wherein the processor and the memory are coupled to a computer board and the computer board is at least partially surrounded by the gel.

6. The computer apparatus of claim 5, further comprising connection circuitry at least partially surrounded by the gel and coupled to provide a signal between a panel of the casing and the computer board.

7. The computer apparatus of claim 1, wherein the casing is to include an exterior panel to receive incoming sensor data from a light detection and ranging (LIDAR) sensor of an autonomous or semi-autonomous vehicle.

8. The computer apparatus of claim 7, wherein the computer component comprises a hardware accelerator, a graphics processor, a signal processor, or a communication device to collaborate to analyze incoming sensor data from the LIDAR sensor.

9. A method of providing a computer component and protection for the computer component from potential vibrational force, comprising:
providing the computer component, wherein the computer component includes a processor and a memory;
positioning the computer component in a casing; and
adding a gel-like material to the casing to substantially surround the computer component, wherein the gel-like material is configured to dampen mechanical shock or vibrational impact on the processor and the memory of the computer component, and wherein the gel-like material is further to allow thermal conduction of heat away from the processor and the memory toward an outside panel of the casing based on thermo-conductive properties of the gel-like material, wherein the thermo-conductive properties are determined based at least in part upon a level of power to be generated by the computer component and physical dimensions of the casing.

10. The method of claim 9, wherein adding the gel-like material comprises filling the casing with a shear-thickening gel to allow for viscous dampening of mechanical stress.

11. The method of claim 9, wherein adding the gel-like material to the casing comprises adding a silicon-polymer based liquid gel to the casing.

12. A system to provide thermo-mechanical protection to a computer unit, including:
a printed circuit board and including electronic components coupled to the printed circuit board;
a casing to include a visco-elastic substance configured to dampen mechanical shock or vibrational impact on the computer unit, to substantially surround the computer unit, and to thermally conduct heat away from heat generated by the electronic components toward an outer panel of the casing; and
a cooling system, coupled to the casing to remove at least some of the thermally-conducted heat from the casing, wherein the cooling system includes pipes within the casing to provide a refrigerant to assist in removal of the at least some of the thermally-conducted heat from the casing, wherein the refrigerant is physically separate from the visco-elastic substance.

13. The system of claim 12, wherein the cooling system is coupled to a vapor-compression refrigeration cycle of an automobile to remove at least some of the thermally-conducted heat from the casing.

14. The system of claim 12, wherein the cooling system is to capacitively store heat in the visco-elastic substance to control a level of heat to be cooled by the cooling system.

15. The system of claim 12, wherein the computer unit is to perform tasks related to machine learning and/or autonomous activity.

16. The system of claim 12, wherein an outside surface of the casing is to include sensor connections to receive signals indicating at least one of temperature, pressure, and an inertial measurement unit (IMU) and wherein circuitry is to provide the signals to the printed circuit board.

17. The system of claim 16, further comprising radiofrequency (RF) antennas on the outside surface of the casing to receive a signal to be provided to the printed circuit board.

18. The system of claim 12 wherein the visco-elastic substance comprises a gel having thermo-conductive properties determined based at least in part upon a level of power to be generated by the computer unit and physical dimensions of the casing.

19. The system of claim 18, wherein the gel has a thermal conductivity of 0.6-2 watts per meter-kelvin (W/m-K).

20. The system of claim 12, wherein the computer unit comprises a command and control computer for an autonomous or semi-autonomous driving vehicle, an unmanned aerial vehicle, or a robot.

* * * * *

UNITED STATES PATENT AND TRADEMARK OFFICE
CERTIFICATE OF CORRECTION

PATENT NO. : 11,609,614 B2
APPLICATION NO. : 16/639714
DATED : March 21, 2023
INVENTOR(S) : Ali Moradi et al.

It is certified that error appears in the above-identified patent and that said Letters Patent is hereby corrected as shown below:

In the Claims

Column 13
Lines 38-39, Claim 1, "..., wherein the refrigerant is physically separate from the visco-elastic substance." should read "..., wherein the refrigerant is physically separate from the gel."

Signed and Sealed this
Ninth Day of May, 2023

Katherine Kelly Vidal
*Director of the United States Patent and Trademark Office*